United States Patent
Nakahara et al.

(10) Patent No.: US 8,197,718 B2
(45) Date of Patent: Jun. 12, 2012

(54) PASTE COMPOSITION AND SOLAR CELL ELEMENT USING THE SAME

(75) Inventors: Jun Nakahara, Osaka (JP); Gaochao Lai, Osaka (JP); Haruzo Katoh, Osaka (JP); Takashi Watsuji, Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 677 days.

(21) Appl. No.: 11/922,019

(22) PCT Filed: Jun. 1, 2006

(86) PCT No.: PCT/JP2006/310966
§ 371 (c)(1),
(2), (4) Date: Dec. 12, 2007

(87) PCT Pub. No.: WO2007/004375
PCT Pub. Date: Jan. 11, 2007

(65) Prior Publication Data
US 2008/0302411 A1   Dec. 11, 2008

(30) Foreign Application Priority Data
Jul. 5, 2005   (JP) .................. 2005-195979

(51) Int. Cl.
*H01L 31/00* (2006.01)
(52) U.S. Cl. ........ 252/514; 252/500; 252/512; 136/252; 136/256
(58) Field of Classification Search .................. 252/500, 252/512, 514; 136/243, 252, 256
See application file for complete search history.

(56) References Cited

U.S. PATENT DOCUMENTS

| | | | |
|---|---|---|---|
| 4,293,451 A | 10/1981 | Ross | |
| 6,555,594 B1* | 4/2003 | Fukushima et al. | 522/81 |
| 2001/0029977 A1 | 10/2001 | Oya | |
| 2004/0003836 A1* | 1/2004 | Watsuji et al. | 136/243 |
| 2004/0055635 A1 | 3/2004 | Nagakubo et al. | |
| 2004/0245507 A1* | 12/2004 | Nagai et al. | 252/500 |
| 2004/0260020 A1* | 12/2004 | Miyake et al. | 525/61 |
| 2006/0044098 A1* | 3/2006 | Kimura et al. | 336/122 |
| 2006/0231802 A1* | 10/2006 | Konno | 252/500 |
| 2006/0272700 A1* | 12/2006 | Young et al. | 136/256 |

FOREIGN PATENT DOCUMENTS

| | | |
|---|---|---|
| GB | EP0466344 A1 * | 1/1992 |
| JP | 60-140882 A | 7/1985 |
| JP | 5-129640 A | 5/1993 |
| JP | 2000-90734 A | 3/2000 |
| JP | 2001-202822 A | 7/2001 |
| JP | 2002-109957 A | 4/2002 |
| JP | 2002-111015 A | 4/2002 |

(Continued)

*Primary Examiner* — Mark Kopec
*Assistant Examiner* — Tri V Nguyen
(74) *Attorney, Agent, or Firm* — Birch, Stewart, Kolasch & Birch, LLP

(57) ABSTRACT

Provided are a paste composition making it possible to improve the adhesive property of a backside electrode and restrain an aluminum electrode layer from exfoliating, and a solar cell element having an electrode formed by use of this composition. The paste composition is a paste composition for forming an electrode (8) on a silicon semiconductor substrate (1) which comprises aluminum powder, an organic vehicle, and a tackifier. The solar cell element has the electrode (8) formed by painting a paste composition having the above-mentioned characteristic onto the silicon semiconductor substrate (1) and then firing the resultant.

1 Claim, 1 Drawing Sheet

FOREIGN PATENT DOCUMENTS

| JP | 2004-134775 A | | 4/2004 |
| JP | 2005093145 A | * | 4/2005 |
| JP | 2005-174698 A | | 6/2005 |
| WO | WO2004053901 A1 | * | 6/2004 |

* cited by examiner

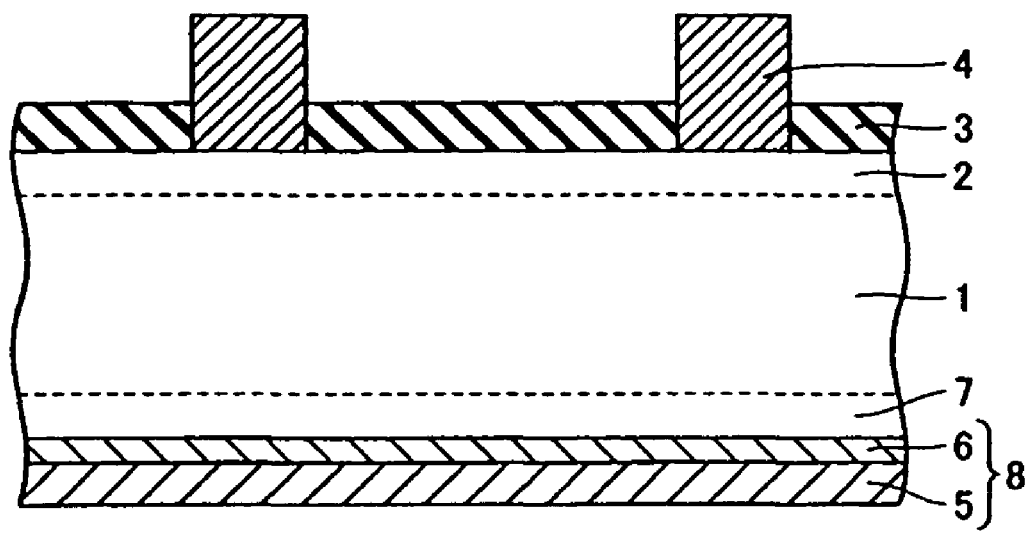

PASTE COMPOSITION AND SOLAR CELL ELEMENT USING THE SAME

TECHNICAL FIELD

This invention relates generally to a paste composition and a solar cell element using the same, and in particular to a paste composition used at the time of forming an electrode on a silicon semiconductor substrate which constitutes a crystalline silicon solar cell, and a solar cell element using the same.

BACKGROUND ART

As an electronic member wherein an electrode is formed on a silicon semiconductor substrate, known is a solar cell element as disclosed in Japanese Patent Application Laid-Open Publication No. 2000-90734 (Patent Document 1) or Japanese Patent Application Laid-Open Publication No. 2004-134775 (Patent Document 2).

FIG. 1 is a view schematically showing a generally sectional structure of a solar cell element.

As shown in FIG. 1, the solar cell element is formed, using a p type silicon semiconductor substrate 1 having a thickness of 200 to 300 μm. An n type impurity layer 2 having a thickness of 0.3 to 0.6 μm is formed on the side of a light-receiving face of the silicon semiconductor substrate 1, and an antireflection layer 3 and grid electrodes 4 are formed thereon.

An aluminum electrode layer 5 is formed on the backside of the p type silicon semiconductor substrate 1. The aluminum electrode layer 5 is formed by applying a paste composition composed of aluminum powder, glass frit and an organic vehicle by screen printing or the like, drying the composition and then firing the resultant at a temperature of 660° C. (the melting point of aluminum) or higher for a short time. At the time of this firing, aluminum diffuses into the p type silicon semiconductor substrate 1, thereby forming an Al—Si alloy layer 6 between the aluminum electrode layer 5 and the p type silicon semiconductor substrate 1 and simultaneously forming a $p^+$ layer 7 as an impurity layer based on the diffusion of aluminum atoms. The presence of this $p^+$ layer 7 gives the BSF (back surface field) effect of preventing electrons from being recombined and improving the efficiency of collecting generated carriers.

As disclosed in, for example, Japanese Patent Application Laid-Open Publication No. 5-129640 (Patent Document 3), the following solar cell element is put to practical use: a solar cell element wherein a backside electrode 8 composed of an aluminum electrode layer 5 and an Al—Si alloy layer 6 is removed with an acid or the like and a collecting electrode is newly made from a silver paste or the like. However, it is necessary to dispose of the acid used to remove the backside electrode 8. Due to the removing step, there are caused problems such that the process becomes complicated. In order to avoid such problems, recently, a solar cell element has been frequently constructed in the state that the backside electrode 8 is left and used, as it is, as a collecting electrode.

Patent Document 1: Japanese Patent Application Laid-Open Publication No. 2000-90734
Patent Document 2: Japanese Patent Application Laid-Open Publication No. 2004-134775
Patent Document 3: Japanese Patent Application Laid-Open Publication No. 5-129640

DISCLOSURE OF THE INVENTION

Problems to be Solved by the Invention

Incidentally, the adhesive property of the backside electrode 8 may lower in accordance with the surface state of the silicon semiconductor substrate. In this case, there is caused a problem that the aluminum electrode layer 5 exfoliates.

Thus, an object of the present invention is to solve the above-mentioned problems and provide a paste composition which makes it possible to cause an improvement in the adhesive property of a backside electrode and restrain an aluminum electrode layer from exfoliating, and a solar cell element having an electrode formed by use of the composition.

Means for Solving the Problems

In order to solve the problems in the prior art, the inventors have repeated eager researches so as to find out that the use of a paste composition having a specific composition makes it possible to attain the above-mentioned object. On the basis of this finding, the paste composition according to the present invention has the following characteristics.

The paste composition according to this invention is a paste composition for forming an electrode on a silicon semiconductor substrate, which comprises aluminum powder, an organic vehicle, and a tackifier.

Preferably, in the paste composition of this invention, the tackifier comprises at least one selected from the group consisting of polypropylene based resin, polyvinyl chloride based resin, polyurethane based resin, rosin based resin, terpene based resin, phenol based resin, aliphatic petroleum resin, acrylic ester based resin, xylene based resin, coumarone indene based resin, styrene based resin, dicyclopentadiene based resin, polybutene based resin, polyether based resin, urea based resin, melamine based resin, vinyl acetate based resin, polyisobutyl based resin, isoprene based rubber, butyl rubber, styrene-butadiene based rubber, and nitrile based rubber.

Preferably, the paste composition of this invention comprises 0.05% or more and 5% or less by mass of the tackifier.

More preferably, the paste composition of this invention further comprises glass frit.

The solar cell element according to this invention has an electrode formed by painting a paste composition having any one of the above-mentioned characteristics onto a silicon semiconductor substrate and then firing the resultant.

Advantageous Effects of the Invention

As described above, according to this invention, a paste composition comprising a tackifier is used, thereby making it possible to improve the adhesive property of an aluminum electrode layer formed on the backside surface of a silicon semiconductor substrate and improve the production yield of solar cell elements.

BRIEF DESCRIPTION OF THE DRAWINGS

FIG. 1 is a view schematically showing, as an embodiment, a generally sectional structure of a solar cell element to which the invention is applied.

EXPLANATION OF REFERENCE NUMBERS

1: p type silicon semiconductor substrate, 2: n type impurity layer, 3: antireflection layer, 4: grid electrode, 5: aluminum electrode layer, 6: Al—Si alloy layer, 7: $p^+$ layer, and 8: backside electrode.

BEST MODE FOR CARRYING OUT THE INVENTION

The paste composition of the present invention comprises a tackifier besides aluminum powder and an organic vehicle. The incorporation of this tackifier into a paste composition makes it possible to heighten the adhesive property of an aluminum electrode layer formed on the backside surface of a silicon semiconductor substrate after the paste is painted and then fired, and restrain the aluminum electrode layer from exfoliating.

Hitherto, there has been frequently caused a phenomenon that in accordance with the surface state of a silicon semiconductor substrate, the adhesive property of an aluminum electrode layer formed on the backside surface thereof lowers so that the aluminum electrode layer exfoliates from the backside surface of the silicon semiconductor substrate. In order to restrain the exfoliation of the aluminum electrode layer, it can be supposed that the content by percentage of an organic vehicle in the paste composition is increased. However, if the content by percentage of the organic vehicle is increased, the viscosity of the paste composition increases and additionally there is caused a problem that aluminum is hindered from being fired by the presence of an excess of the organic vehicle.

In the present invention, a tackifier, which is very good in adhesive performance, is used, thereby making it possible to improve the adhesive property of an aluminum electrode layer formed on the backside surface of a silicon semiconductor substrate without producing a necessity that the content by percentage of an organic vehicle in the paste composition is excessively increased.

The component of the organic vehicle incorporated into the paste composition of the present invention is not particularly limited, and the following can be used: a resin such as ethylcellulose or alkyd resin, and a solvent such as a glycol ether based or terpineol based solvent. The content by percentage of the organic vehicle is preferably 20% or more by mass and 40% or less by mass. If the content by percentage of the organic vehicle is less than 20% by mass or is more than 40% by mass, the printability of the paste lowers.

The content by percentage of the aluminum powder incorporated into the paste composition of the present invention is preferably 60% or more by mass and 80% or less by mass. If the content by percentage of the aluminum powder is less than 60% by mass, the resistance of the fired aluminum electrode layer becomes high so that the energy conversion efficiency of the solar cell may lower. If the content by percentage of the aluminum powder is more than 80% by mass, the paintability of the paste deteriorates in screen printing or the like.

The tackifier incorporated into the paste composition of the present invention is not particularly limited, and may be any organic material that has a good adhesive performance. For example, the following material is suitable as the tackifier: polypropylene based resin, polyvinyl chloride based resin, polyurethane based resin, rosin based resin, terpene based resin, phenol based resin, aliphatic petroleum resin, acrylic ester based resin, xylene based resin, coumarone indene based resin, styrene based resin, dicyclopentadiene based resin, polybutene based resin, polyether based resin, urea based resin, melamine based resin, vinyl acetate based resin, polyisobutyl based resin, isoprene based rubber, butyl rubber, styrene-butadiene based rubber, and nitrile based rubber. As the case may be, one or more selected from the above-mentioned material group may be used as the tackifier.

The decomposition temperature of each constituent material of the tackifier used in the present invention is not higher than the firing temperature (660° C. or higher) for forming the $p^+$ layer; the tackifier remains without being completely decomposed since the firing time is short (usually, 30 seconds or less). As a result, the adhesive property of the aluminum electrode layer can be improved.

The content by percentage of the tackifier incorporated into the paste composition of the present invention is preferably 0.05% or more by mass and 5% or less by mass. If the content by percentage of the tackifier is less than 0.05% by mass, the effect of restraining the fired aluminum electrode layer from exfoliating is not obtained. If the content by percentage is more than 5% by mass, the viscosity of the paste rises so that the printability lowers.

Furthermore, the paste composition of the present invention may contain glass frit. The content by percentage of the glass frit is preferably 6% or less by mass. The glass frit also has an effect of improving the adhesive property of the aluminum electrode layer after the composition is fired. If the content by percentage of the glass frit is more than 6% by mass, segregation is generated in the glass so that the resistance of the aluminum electrode layer may increase.

The glass frit incorporated into the paste composition of the present invention is not particularly limited about the composition thereof or the content by percentage of each component of the frit as long as the softening temperature of the frit is not higher than the firing temperature. The glass frit which can be ordinarily used is, for example, $B_2O_3$—$SiO_2$—$Bi_2O_3$ based, $B_2O_3$—$SiO_2$—$ZnO$ based or $B_2O_3$—$SiO_2$—$PbO$ based glass frit besides $SiO_2$—$Bi_2O_3$—$PbO$ based glass frit.

EXAMPLES

One example of the invention will be described hereinafter.

First, produced were paste compositions which each contained 60 to 80% by mass of aluminum powder, 0 to 6% by mass of glass frit and 20 to 40% by mass of an organic vehicle wherein ethylcellulose was dissolved in a glycol ether based organic solvent, and contained various tackifiers each added at a proportion shown in Table 1.

Specifically, aluminum powder and $B_2O_3$—$SiO_2$—$PbO$ based glass frit were added to an organic vehicle wherein ethylcellulose was dissolved in a glycol ether based organic solvent, and further each of various tackifiers was added thereto in an added amount shown in Table 1. These components were then mixed by means of a well-known mixer. In this way, paste compositions (Examples 1 to 4) were produced. In the same way as described above, a paste composition in the prior art (Comparative Example 1), to which no tackifier was added, and a paste composition to which a small amount of a tackifier was added (Comparative Example 2) were produced, as shown in Table 1.

The used aluminum powder was powder made of particles having shapes of spheres having an average particle size of 2 to 20 μm, or shapes similar to the spheres from the viewpoint of keeping the reactivity with a silicone semiconductor substrate, the applicability (paintability), and evenness in the film to be applied. About the tackifiers shown in Table 1, the tackifiers were each dissolved into a predetermined organic solvent. The resultant agents were used (the wording "added amount" shown in Table 1 represents the percentage of the solid content in each of the agents).

The above-mentioned various paste compositions were each applied/printed onto a p type silicon semiconductor substrate, 150 mm×150 mm in size and 220 μm in thickness, using a 250-mesh screen printing plate. The resultants were dried. The applied amount was set in such a manner that the thickness of an aluminum electrode layer after being fired would be from 30 to 35 μm.

The p type silicon semiconductor substrates on which the respective pastes were printed were dried, and fired in an infrared firing furnace under conditions that the substrates were heated at a heating rate of 400° C./minute and then the temperature was kept at 700° C. for 15 seconds in the atmosphere of air. After the firing, the substrates were cooled to yield structures, each of which is as shown in FIG. 1, wherein the aluminum electrode layer 5 and the Al—Si alloy layer 6 were formed on the p type silicon semiconductor substrate 1.

The surface resistance of each of the backside electrode layers, which produces an effect on the ohmic resistance between the electrodes, was measured with a four-point probe surface resistance meter.

Thereafter, the p type silicon semiconductor substrate, on which the backside electrode layer was formed, was immersed into a solution of hydrochloric acid in water, thereby dissolving and removing the aluminum electrode layer 5 and the Al—Si alloy layer 6, and the surface resistance of the p type silicon semiconductor substrate on which the $p^+$ layer 7 was formed was measured with the surface resistance meter.

It is said that the surface resistance of the $p^+$ layer 7 and the BSF effect have a correlative relationship and the BSF effect is higher as the surface resistance is smaller. A target value of the surface resistance was 24 mΩ/□ or less about the backside electrode 8 and 22 mΩ/□ or less about the $p^+$ layer 7.

The mechanical strength and the adhesive property of the aluminum electrode layer 5 formed on each of the silicon semiconductor substrates were evaluated by sticking a cellophane tape onto the surface of the aluminum electrode layer 5, peeling off the tape, and then examining whether or not the aluminum electrode layer 5 was exfoliated.

The surface resistance of each of the backside electrodes 8, the surface resistance of each of the $p^+$ layers 7, and the exfoliation property of each of the aluminum electrode layers 5, which were measured as described above, are shown in Table 1.

TABLE 1

| | Tackifier species | Added amount (% by mass) | Backside electrode surface resistance (mΩ/□) | Si substrate $p^+$ layer surface resistance (Ω/□) | Exfoliation property |
|---|---|---|---|---|---|
| Examples | | | | | |
| 1 | Phenol | 0.2 | 22.4 | 20.0 | o |
| 2 | Phenol | 3.0 | 22.8 | 20.5 | o |
| 3 | Ethyl acrylate | 0.2 | 22.3 | 20.0 | o |
| 4 | Butyl rubber | 0.2 | 22.4 | 20.2 | o |
| Comparative Examples | | | | | |
| 1 | None | 0.0 | 21.9 | 19.6 | x |
| 2 | Phenol | 0.03 | 22.1 | 19.8 | x | o: Exfoliation was not generated
x: Exfoliation was generated

It can be understood from the results shown in Table 1 that by using each of the paste compositions of the present invention (Examples 1 to 4), the adhesive property of the aluminum electrode layer can be made better than by using a paste composition in the prior art (Comparative Example 1) and a paste composition wherein the added amount of a tackifier is small (Comparative Example 2).

The embodiments and the working examples disclosed above should be interpreted to be illustrative and unrestricted in all points. The scope of the invention is specified not by the above-mentioned embodiments or the working examples but by the claims, and is intended to include all modifications and variations having the meaning or range equivalent to that in the claims.

Industrial Applicability

The use of the paste composition of this invention, which comprises a tackifier, makes it possible to improve the adhesive property of an aluminum electrode layer formed on the backside surface of a silicon semiconductor substrate and improve the production yield of solar cell elements.

The invention claimed is:

1. A paste composition for forming an electrode on a silicon semiconductor substrate constituting a solar cell element, comprising aluminum powder, an organic vehicle, a tackifier, and glass frit,
   wherein the tackifier is phenol,
   wherein the concentration of phenol in the paste composition is from 0.2 mass % to 3.0 mass %,
   wherein the concentration of aluminum powder in the paste composition is from 60 mass % to 80 mass %,
   wherein the concentration of the organic vehicle in the paste composition is from 20 mass % to 40 mass %,
   wherein the organic vehicle comprises ethylcellulose, and
   wherein the concentration of glass fit in the paste composition is from 0.05 mass % to 3.0 mass %.

* * * * *